(12) United States Patent
Gill et al.

(10) Patent No.: US 6,791,107 B2
(45) Date of Patent: Sep. 14, 2004

(54) SILICON ON INSULATOR PHASE CHANGE MEMORY

(75) Inventors: Manzur Gill, Cupertino, CA (US); Tyler Lowrey, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 10/336,171

(22) Filed: Jan. 3, 2003

(65) Prior Publication Data

US 2003/0132501 A1 Jul. 17, 2003

Related U.S. Application Data

(62) Division of application No. 09/751,485, filed on Dec. 27, 2000, now Pat. No. 6,531,373.

(51) Int. Cl.[7] .............................................. H01L 29/06
(52) U.S. Cl. .............................. 257/20; 257/5; 257/734; 257/57
(58) Field of Search .......................... 257/2, 20, 5, 734, 257/57; 438/95, 622–625, 900

(56) References Cited

U.S. PATENT DOCUMENTS 6,534,781 B2 * 3/2003 Dennison ....................... 257/5

FOREIGN PATENT DOCUMENTS

EP WO 00/54798 * 9/2000 ........... H01L/47/00

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS–Compatible Phase–Change Nonvolatile RAM Using NMOS Cell Transistors," presented at 2003 19th IEEE Non–Volatile Semiconductor Memory Workshop, Monterey, California, Feb. 26–20, 2003.

Ha, Y.H., Yi, J.H., Horii, H., Park, J.H., Joo, S.H., Park, S.O., Chung, U–In and Moon, J.T., "An Edge Contact Type Cell for Phase Change RAM Featuring Very Low Power Consumption," presented at IEEE 2003 Symposium on VLSI Technology, Kyoto, Japan, Jun. 12–14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase–change RAM Based on 0.24 mm–CMOS Technologies," presented at IEEE 2003 Symposium on VLSI Technology, Kyoto, Japan, Jun. 12–14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U–In and Moon, J.T., "A Novel Cell Technology Using N–doped GeSbTe Films for Phase Change RAM," presented at IEEE 2003 Symposium on VLSI Technology, Kyoto, Japan, Jun. 12–14, 2003.

* cited by examiner

Primary Examiner—Carl Whitehead, Jr.
Assistant Examiner—Yennhu B. Huynh
(74) Attorney, Agent, or Firm—Trop, Pruner & Hu, P.C.

(57) ABSTRACT

The invention relates to a phase-change memory device that uses SOI in a chalcogenide volume of memory material. Parasitic capacitance, both vertical and lateral, are reduced or eliminated in the inventive structure.

10 Claims, 6 Drawing Sheets

SILICON ON INSULATOR PHASE CHANGE MEMORY

This is a divisional of prior application Ser. No. 09/751,485, filed Dec. 27, 2000, now U.S. Pat. No. 6,531,373.

BACKGROUND OF THE INVENTION

1. Field of the Invention

The present invention relates to a phase-change memory device. More particularly, the present invention relates to a silicon on insulator (SOI) lower electrode in a chalcogenide memory cell. In particular, the present invention relates to an isolation device for a phase-change memory material that is formed in monocrystalline silicon on a buried insulator.

2. Description of Related Art

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. Typical materials suitable for such application include those utilizing various chalcogenide elements. These electrical memory devices typically do not use field effect transistor devices, but comprise, in the electrical context, a monolithic body of thin film chalcogenide material. As a result, very little chip real estate is required to store a bit of information, thereby providing for inherently high-density memory chips. The state change materials are also truly non-volatile in that, when set in either a crystalline, semi-crystalline, amorphous, or semi-amorphous state representing a resistance value, that value is retained until reset as that value represents a physical state of the material (e.g., crystalline or amorphous). Thus, phase change memory materials represent a significant improvement in non-volatile memory.

One aspect of fabrication deals with the presence of parasitic effects in a bipolar isolation device. FIG. 1 is an array schematic for a high-density memory architecture that uses bipolar device isolation. At each cell location the data or bit line (BL, typically called the column line) connects to the phase-change structure, which is connected in series to a fixed resistor and then to a PNP bipolar emitter. The base of the emitter connects to a common row line (WL, typically called a word line).

FIG. 1 illustrates a vertical bipolar device that results in a degree of parasitic vertical capacitance. This capacitance results from the indigenous effect of isolation that is required in the P-N diodes. Some of the disadvantages include the fact that collector current goes to the substrate in the form of a collector or ground and must be collected at the array periphery. Since it is desirable to use these arrays with complementary metal oxide semiconductor (CMOS) technology such as N-channel and P-channel transistors in the die periphery, areas that consume P+ diffusion and N+ and N− (N well) guardbar structures must be provided around the array to reduce the possibility of latch-up. These structures reduce array efficiency and increase chip size and cost. Also the number of bits programmed in parallel may be limited due to the possibility of latch-up. Additionally, the bipolar gain, also known as the beta, of the parasitic vertical bipolar device will vary in conventional CMOS processing over a relatively wide range. This affects the amount of emitter current that goes to the row line instead of the substrate. Hence product design is more difficult and must be more conservative in order to harden the device against worst-case scenarios.

FIG. 2 illustrates an array schematic for a high-density memory architecture that uses both vertical 25 and horizontal 26 isolation. As a result, both vertical and horizontal parasitic bipolar effects cause a degree of reduced performance of the memory device. One disadvantage of a parasitic lateral bipolar device is that current passing through the emitter is collected by each collector. The bipolar gain, also know as the beta, of the parasitic lateral bipolar devices will vary in the conventional CMOS process over a relatively wide range. This affects the amount of emitter current that goes to the row line instead of the neighboring bits. Hence product design is more difficult and must be more conservative in order to harden the device against worst-case scenarios. Another challenge is that collector current then passes through neighboring unselected phase-change devices; a disturb current therefore passes through them. This phenomenon may result in affected retention time for data storage or the reliability of the memory state of these neighboring devices. Another challenge is that managing the lateral disturb requires technology trade-offs. The diodes must be separated by structures such as a deep trench. Alternatively or additionally, the diodes must be spaced apart more to minimize the parasitic lateral bipolar current. Another challenge is that there exists a parasitic capacitance between the base and the collector of each parasitic lateral bipolar device. This lateral parasitic capacitance slows the memory device because row line capacitance is increased.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

The present invention relates to a silicon on insulator (SOI) phase-change memory device. The SOI device reduces or eliminates both vertical and lateral parasitic capacitance.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientation. Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 3:
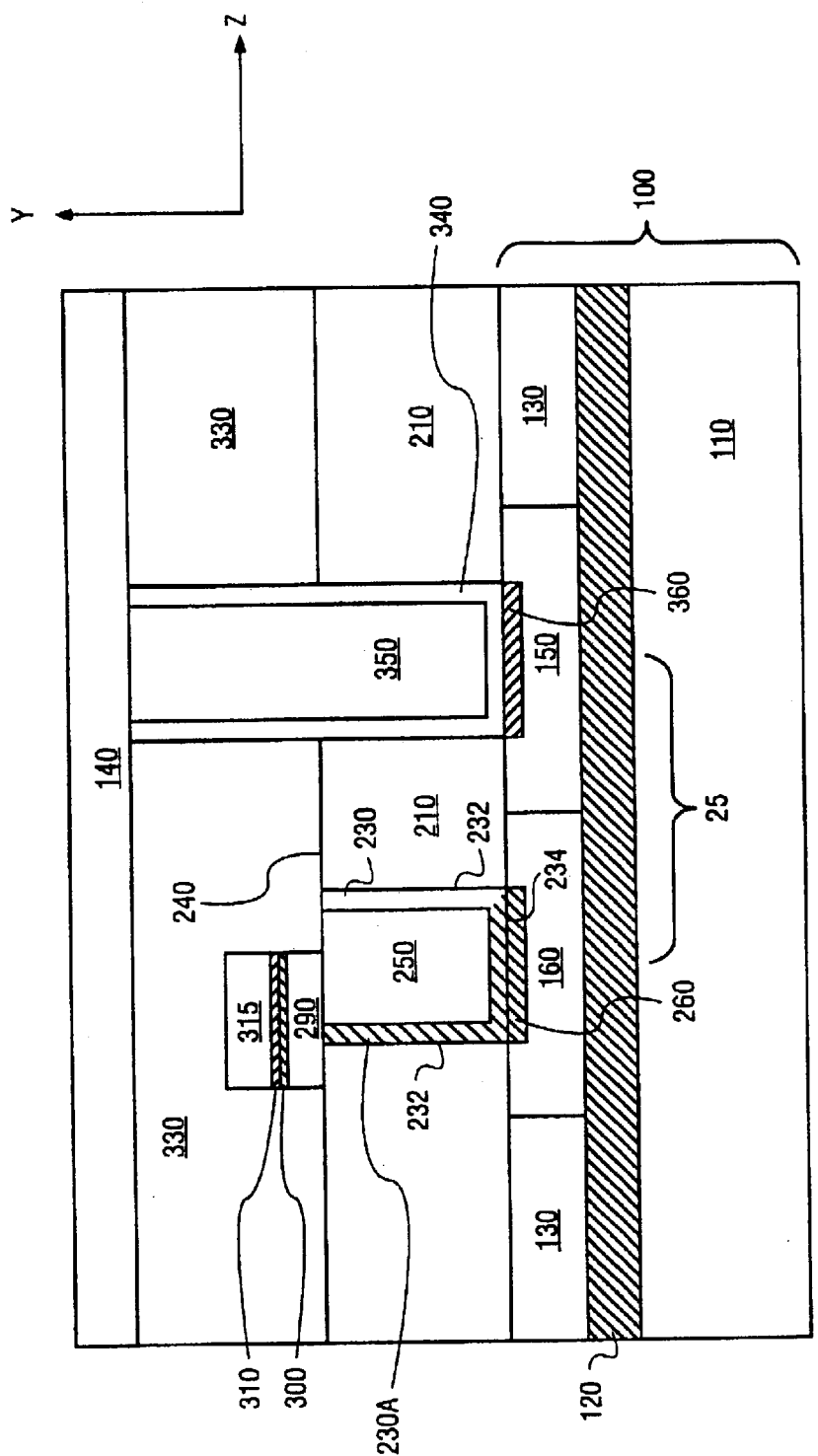
FIG. 3 shows an elevational cross-section view of an SOI semiconductor structure on a semiconductive substrate.

FIG. 3 shows an elevational cross-section view of a semiconductor structure on a semiconductive substrate 100. Typically, semiconductive substrate 100 is silicon, and preferably monocrystalline silicon. A layer of bulk silicon 110 may be doped according to a specific application. Above bulk silicon 110, an insulator layer 120 is formed. In SOI technology, insulator layer 120 may be formed by various processes. In one process embodiment, insulator layer 120 is formed by oxygen implantation into semiconductive substrate 100 at a dose in the range from about $10^{16}$ to about $10^{19}$ atoms/cm$^3$ and in a depth that begins below the top surface of substrate 100 in a range from about 500 Å to about 5,000 Å. Insulator layer 120 may be therefore buried beneath the upper surface of bulk silicon 110. After implantation of insulator layer 120, semiconductive substrate 100 may be annealed as is known in the art. In one embodiment, an anneal process is carried out to activate the implanted oxygen with the oxygen dose range set forth herein. Anneal temperatures are selected in the range from about 800° C. to about 1,200° C. when the implant is oxygen. Other implant materials may be used such a nitrogen, followed by an anneal to form silicon nitride, $Si_xN_y$, in both stoichiometric (such as $Si_3N_4$) and other solid solution ratios. In any event, where insulator layer 120 is a buried structure in silicon, implant materials are selected to render that portion substantially dielectric.

Following formation of a buried insulator layer 120, shallow isolation structures 130 may be formed in semiconductive substrate 100. Shallow isolation structures 130 may be a filled oxide followed by etchback or chemical mechanical polishing (CMP). Shallow isolation structures 130 may also be undoped monocrystalline silicon, or counter-doped monocrystalline silicon to render the silicon substantially dielectric in comparison to any doping effects that may have existed incident to the doping of bulk silicon 110. As will become apparent in the subsequent discussion, STI structures 130 serve, in one aspect, to define the x-direction thickness of a memory element cell, with at this point only the x-direction thickness of a memory element cell defined. In another aspect, STI structures 130 serve to isolate individual memory elements from one another as well as associated circuit elements such as transistor devices formed in and on substrate 100. STI structures 130 are formed according to techniques known to those skilled in the art.

Further isolation of the memory cell may be accomplished, for example, by forming an isolation device such as a diode 25. In one example, the isolation device is a PN diode 25 formed of an N-type silicon portion 150 that may have a virtual dopant concentration on the order of about $10^{17}$–$10^{18}$ atoms/cm$^3$, and P-type silicon portion 160 that may have a virtual dopant concentration on the order of about $10^{19}$–$10^{20}$ atoms/cm$^3$. One method to simplify process flow is to dope both portions 150 and 160 without a mask and then to mask one portion and counter dope the exposed portion to achieve a virtual or effective concentration. By using a single mask, the junction is self-aligned.

Although a PN diode 25 is shown, it is to be appreciated that other isolation devices are similarly suitable. Such isolation devices include, but are not limited to, MOS devices.

FIG. 3 also shows the inventive process of forming a lower electrode 230 in a phase-change memory device. The isolation device comprising N-type silicon portion 150 and P-type silicon portion 160 is overlaid with dielectric materials 210 and a lower electrode 230 is formed in a recess that may be defined by sidewalls 232 and a base 234.

Figure 4:
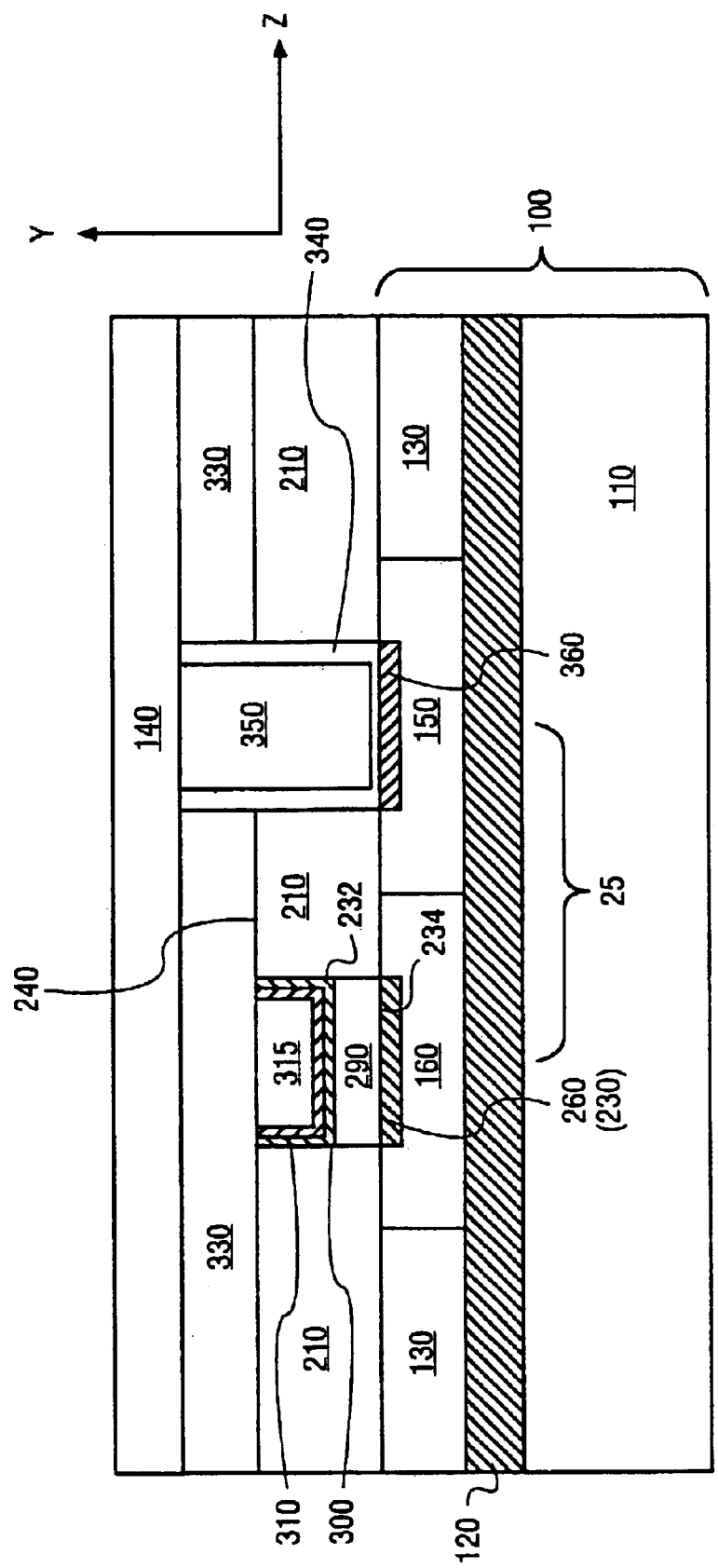
FIG. 4 shows an elevational cross-section view of an SOI semiconductor structure on a semiconductive substrate.

Prior to the formation of lower electrode 230 a self-aligned P-type portion 260 may be implanted into P-type silicon portion 160 as an emitter enhancer. In one embodiment, self-aligned P-type portion 260 may act as the lower electrode 260 (effectively, a lower electrode 230) as illustrated in FIG. 4. Where lower electrode 260 is a high resistivity metal compound film as set forth herein, it may be formed by PVD that may be collimated in order to achieve a structure that is substantially self aligned to the recess. Alternatively, lower electrode 260 may be a self-aligned implantation such that the silicon in silicon portion 160 is enriched with metals sufficient to form a metal silicon compound film or a metal silicon nitride film as set forth herein. Alternatively, a metal compound film or polysilicon film lower electrode may be deposited upon the top of substrate 100 at the base 234 by collimated sputtering of the appropriate material under collimated sputtering conditions that cause substantially all deposition to occur only at base 234 and not substantially upon sidewalls 232.

Where lower electrode 260 is formed in silicon, typically monocrystalline silicon, implantation is carried out sufficient to form an enriched portion that results in a heater element. Consequently, lower electrode 260 may be referred to as "a lower electrode on the second conductivity type portion" although it may be an integral part of monocrystalline silicon in second portion 160.

Referring further to FIG. 4, a damascene structure may be formed wherein dielectric materials 210 are used to form a recess into which a volume of memory materials 190 is introduced. Further, liner layers 300 and 310 may be introduced into the recess in dielectric materials 210, followed by filling with signal line material 315 into the recess in dielectric materials 210. Thereafter, a third dielectric material 330 (where isolation structure 130 is a first dielectric material and dielectric materials 210 is a second dielectric material) is formed and a contact 350 is formed as will be set forth herein. It is understood that such a damascene structure may also be applied to the device depicted in FIG. 3 after the formation of dielectric materials 210.

Referring again to FIG. 3, lower electrode 230 will be referred to as a metal compound film although it may also be a polysilicon film as set forth herein. Where lower electrode 230 is a metal, the material of lower electrode material 230 is preferably a high resistivity metal compound such as metal nitride, a refractory metal nitride, a metal silicon nitride, a refractory metal silicon nitride, a metal silicide, and a refractory metal silicide. Where lower electrode 230 is a polysilicon material, it may be angle-implanted and thermally activated to form a conductive electrode 230A, and an insulative portion 230.

The introduction of metal compound film 230 is introduced along the sidewalls 232 and base 234 of the recess such that metal compound film 230 is in contact with P-doped portion 160 and self-aligned doped 260 if present. The conformal introduction of metal compound film 230 that is the inventive metal nitride and/or silicide compound may follow conventional introduction techniques known to those skilled in the art including chemical vapor deposition (CVD) techniques.

The recess into which metal compound film 230 is deposited may be referred to as a recess that is formed in first dielectric 210 to expose at least a portion of the memory cell active area. Although the recess may be referred to as a trench, the type of recess may be selected from a substantially circular recess, a rectangular (square) recess, and a trench recess.

Metal compound film 230 may include a metal and at least one of nitrogen or silicon. A given blend of metal compound may be accomplished by chemical vapor deposition (CVD) of at least one constituent of nitrogen and silicon in connection with the metal. Preferably, the composition of metal compound film 230 is controlled by feed stream amounts to a CVD tool. Depending upon the specific embodiment, other CVD techniques may be used such as plasma enhanced CVD (PECVD).

In another embodiment, the formation of metal compound film 230 is carried about by physical vapor deposition (PVD) and a target is selected that has a preferred composition for the final metal compound film. Alternatively, a plurality of targets may be combined to achieve a preferred metal compound film composition. In either PVD or CVD, coverage as defined as the ratio of wall deposited thickness to top-deposited thickness, is in a range from about 0.25 to about 1, and preferably above 0.5. In the present invention, CVD formation of lower electrode is preferred. In all embodiments, where sputtering is carried out, collimated sputtering may be used as set forth herein.

Following the formation of metal compound film 230, metal compound film 230 is overlaid with a second dielectric 250. Second dielectric 250 may be formed by chemical vapor deposition of a silicon-containing substance selected from silicon oxide such a tetra ethyl ortho silicate (TEOS) process and the like. Following the formation of second dielectric 250, all material that resides above the top level 240 of the recess is removed. Removal of material may be accomplished by processes such as chemical mechanical planarization (CMP), mechanical planarization, and the like. Removal of material may be accomplished by processes such as isotropic etchback, anisotropic etchback, and the like. In comparison to the formation of a polysilicon lower electrode process the inventive process reduces the complexity of the process flow.

The material of metal compound film 230 in one embodiment is preferably a high resistivity metal compound such as a metal nitride, a refractory metal nitride, a metal silicon nitride, a refractory metal silicon nitride, a metal silicide, and a refractory metal silicide.

Where a metal nitride is selected for metal compound film 230, the metal may be selected from Ti and Zr and the like. It may also be selected from Ta and Nb and the like. It may also be selected from W and Mo and the like. It may also be selected from Ni and Co and the like. The metal nitride is preferably a refractory metal nitride compound of the formula $M_xN_y$. The ratio of M:N is in a range from about 0.5:1 to about 5:1, preferably from about 0.6:1 to about 2:1, and most preferably about 1:1. For example, one embodiment of the present invention is a $Ta_xN_y$ compound in the ratio from about 0.5:1 to about 5:1, preferably from about 0.6:1 to about 2:1, and most preferably about 1:1. Another example of an embodiment is a $W_xN_y$ compound in the ratio from about 0.5:1 to about 5:1, preferably from about 0.6:1 to about 2:1, and most preferably about 1:1.

In another embodiment of the invention, metal compound film 230 may be a metal silicon nitride compound. The metals may be selected from the metal may be selected from Ti and Zr and the like. It may also be selected from Ta and Nb and the like. It may also be selected from W and Mo and the like. It may also be selected from Ni and Co and the like. The metal silicon nitride compound may have the formula $M_xSi_zN_y$, and wherein the ratio of M:Si:N is in a range from about 1:0.5:0.5 to about 5:1:1. Preferably, the ratio is in a range from about 1:1:0.5 to 1:0.5:1, and most preferably about 1:1:1. In one embodiment, a lower electrode material compound is $Ti_xSi_yN_z$ in a ratio from about 1:0.5:0.5 to about 5:1:1, preferably from about 1:1:0.5 to 1:0.5:1, and most preferably about 1:1:1.

In another embodiment, the lower electrode may be a metal silicide compound. The metals may be selected from the metal may be selected from Ti and Zr and the like. It may also be selected from Ta and Nb and the like. It may also be selected from W and Mo and the like. It may also be selected from Ni and Co and the like. The metal suicide compound may have the formula $M_xSi_z$, wherein the ratio of M:Si: is in a range from about 0.5:1 to about 5:1. In one embodiment, a lower electrode material compound is $Ti_xSi_y$ in a ratio from about 0.5:1 to about 5:1, preferably from about 0.6:1 to about 2:1, and most preferably about 1:1. In another embodiment, a lower electrode material compound is $W_xSi_y$ in a ratio from about 0.5:1 to about 5:1, preferably from about 0.6:1 to about 2:1, and most preferably about 1:1.

Following the formation of second dielectric 250, the introduction of a volume of memory material 290 is carried out. In one example, memory material 290 is a phase change material. In a more specific example, memory material 290 includes a chalcogenide element(s). Examples of phase change memory material 290 include, but are not limited to, compositions of the class of tellerium-germanium-antimony ($Te_xGe_ySb_z$) material in both stoichiometric and solid-solution ratios. The volume of memory material 290, in one example according to current technology, is introduced and patterned with a thickness on the order of about 600 Å.

Overlying the volume of memory material 290 in the structure of FIG. 3 are barrier materials 300 and 310 of, for example, titanium (Ti) and titanium nitride (TiN), respectively. Barrier materials serve, in one aspect, to inhibit diffusion between the volume of memory material 290 and second conductor or signal line material overlying the volume of memory material 290. Overlying barrier materials 300 and 310 is second conductor or signal line material 315. In this example, second conductor or signal line material 315 serves as an address line, a column line. Second conductor or signal line material 315 is patterned to be, in one embodiment, generally orthogonal to a first conductor or signal line material 140 (column lines are orthogonal to row lines). Second conductor or signal line material 315 is, for example, an aluminum material, such as an aluminum alloy. Methods for the introduction and patterning of the barrier materials and second conductor or signal line material 315 include such techniques as known to those of skill in the art.

Following the formation of signal line material 315, a third dielectric material 330 is formed over second conductor or signal line material 315. Third dielectric material 330 is, for example, SiO$_2$ or other suitable material that surrounds second conductor or signal line material 315 and memory material 290 to electronically isolate such structure. Following introduction, third dielectric material 330 is planarized and a via is formed in a portion of the structure through third dielectric material 330, second dielectric material 210, to N-doped silicon portion 150. The contact surface of N-doped portion 150 may be further doped in a self-aligned N-type process to form an N-type base 360. N-type base 360 may be at the same level as the P-type emitter that is the optional self-aligned doped portion 260 of the P-doped silicon portion 160. In concert, N-type base 360 acts as a base and self-aligned doped portion 260 acts as an emitter.

The via is filled with conductive material 350 such as tungsten (W) and barrier material 340 such as a combination of titanium (Ti) and titanium nitride (TiN). Techniques for introducing dielectric material 330, forming and filling conductive vias, and planarizing are known to those skilled in the art.

The structure shown in FIG. 3 also shows the first conductor or signal line 140 that is introduced and patterned as a row line 140 or row select. A suitable material for signal line 140 includes an aluminum material, such as aluminum or an aluminum alloy and may be the same material as signal line material 315.

Figure 5:
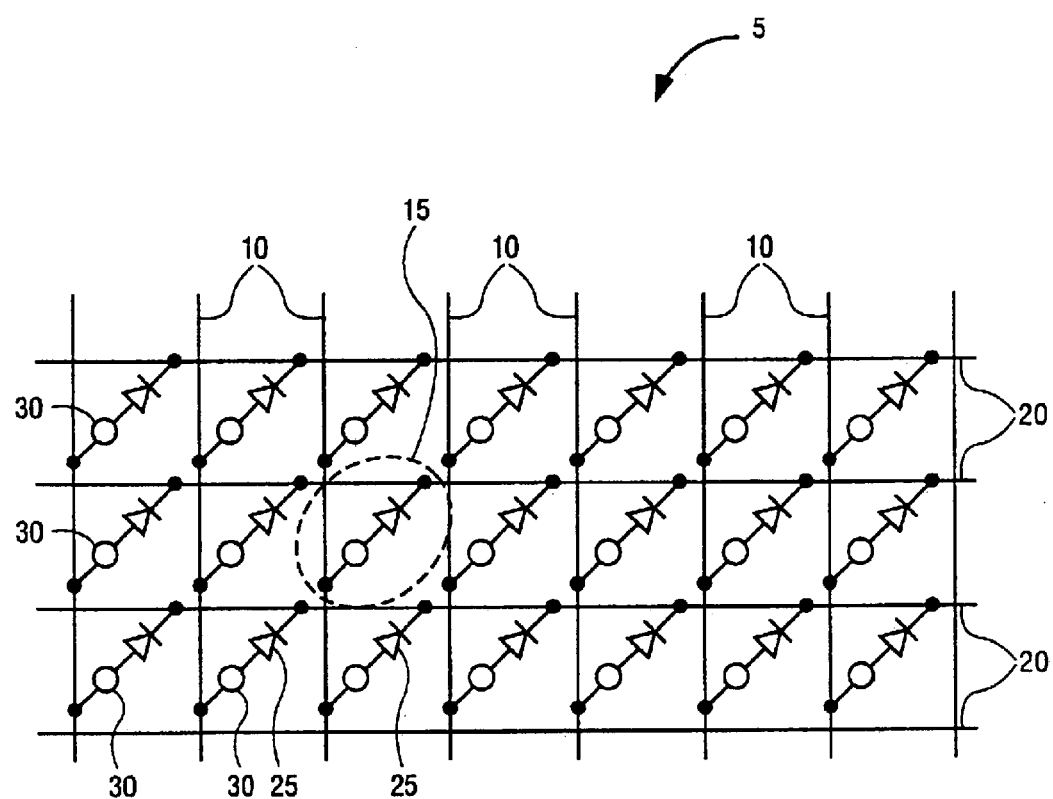
FIG. 5 shows a schematic diagram of an embodiment of a memory array comprised of a plurality of memory elements presented and formed in the context of the invention.

FIG. 5 shows a schematic diagram of an embodiment of a memory array comprised of a plurality of memory elements presented and formed in the context of the invention. In this example, the circuit of memory array 5 includes an array with memory element 30 electrically interconnected in series with isolation device 25 on a portion of a chip. Address lines 10 (e.g., columns) and 20 (e.g., rows) are connected, in one embodiment, to external addressing circuitry in a manner known to those skilled in the art.

One purpose of the array of memory elements in combination with isolation devices in the inventive SOI structure is to enable each discrete memory element to be read and written without interfering with the information stored in adjacent or remote memory elements of the array.

A memory array such as memory array 5 may be formed in a portion, including the entire portion, of a substrate. A typical substrate includes an SOI substrate such as is set forth herein with a buried insulator layer 120 or a stacked insulator layer as set forth herein. Other substrates including, but not limited to, substrates that contain ceramic material, organic material, or glass material as part of the infrastructure are also suitable. In the case of an SOI substrate, memory array 5 may be fabricated over an area of the substrate at the wafer level and then the wafer may be reduced through singulation into discrete die or chips, some or all of the die or chips having a memory array formed thereon. Additional addressing circuitry such as sense amplifiers, decoders, etc. may be formed in a similar fashion as known to those of skill in the art.

In another embodiment, insulator layer 120 may be formed by depositing or growing a dielectric layer upon substrate 100. Because the formation of insulator layer 120 is not necessarily global to the wafer, a deposition or growth process to form insulator layer 120 may be referred to as "forming an insulator layer in a silicon substrate." According to this embodiment, a stacked structure may be formed such that above signal line material 140, a second insulator layer may be formed that acts as the foundation of a second-level SOI phase-change memory device. The structures of first portion 150, second portion 160, and isolation structures 130 may be formed by depositing and doping polysilicon for first portion 150 and second portion 160 and by depositing a dielectric material for isolation structures 130.

Figure 1:
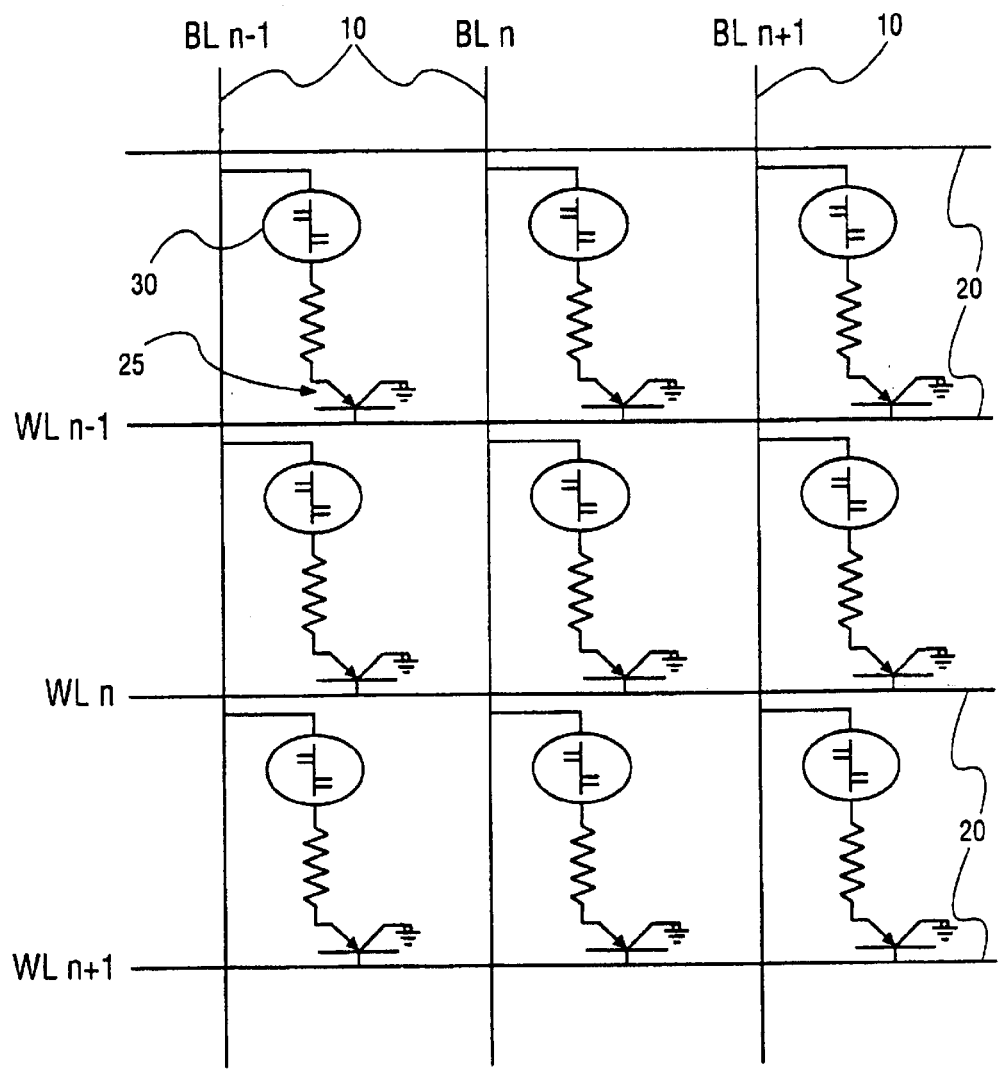
FIG. 1 is an array schematic for a high-density memory architecture that uses bipolar device isolation.
Figure 2:
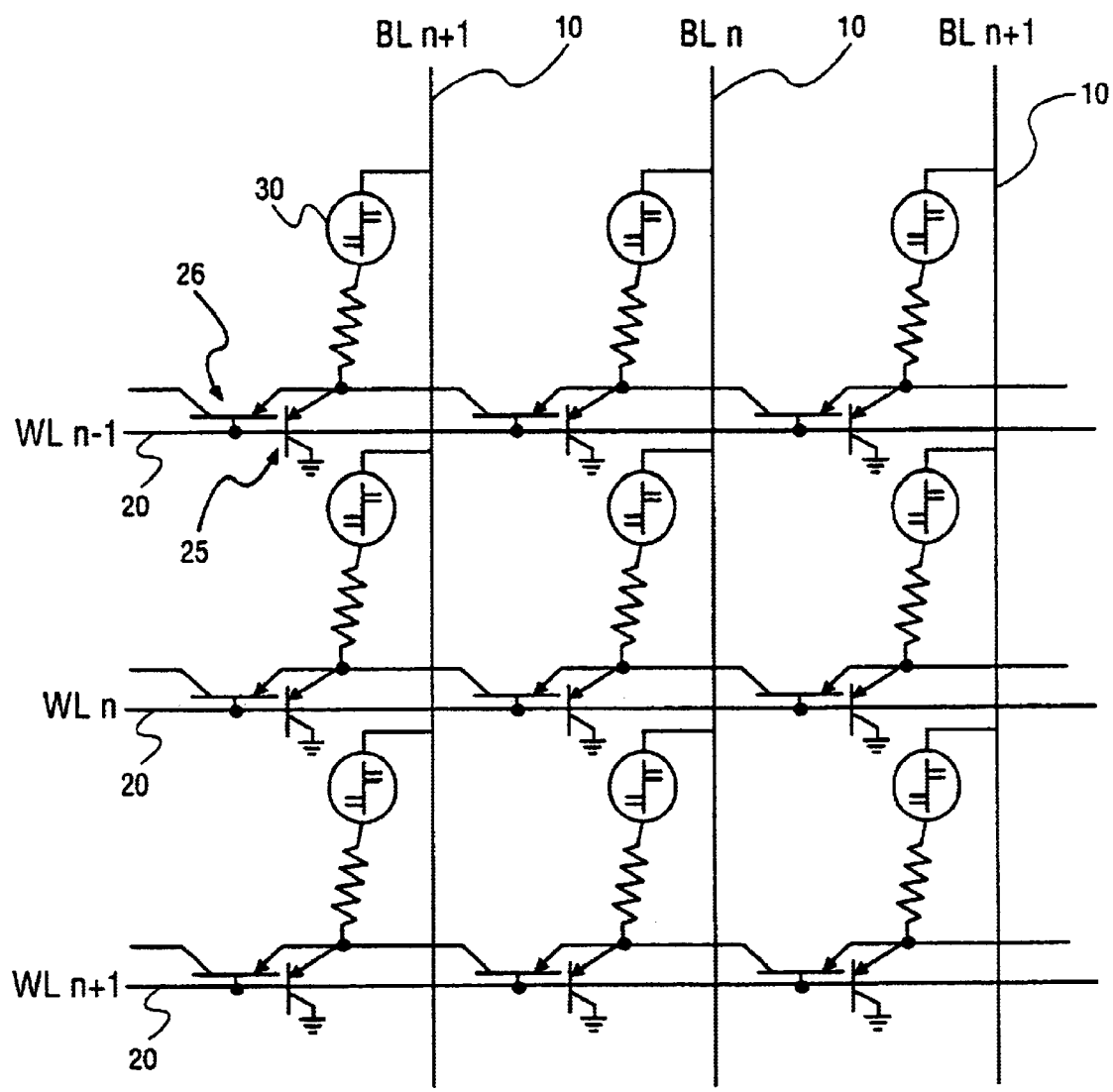
FIG. 2 illustrates an array schematic for a high-density memory architecture that uses both vertical and horizontal isolation.
Figure 6:
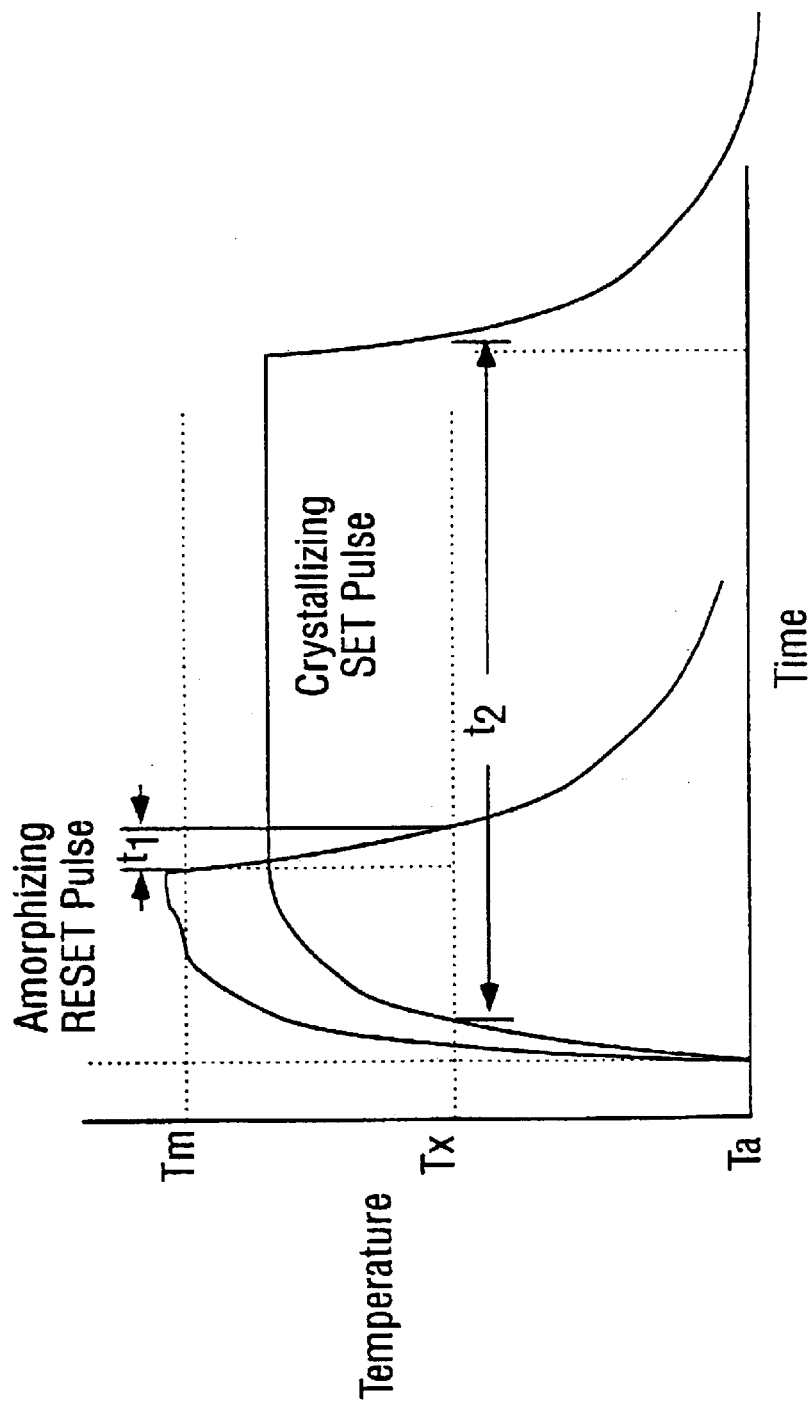
FIG. 6 presents a graphical representation of the setting and resetting of a volume of phase change memory material.

FIG. 6 presents a graphical representation of the setting and resetting of a volume of phase change memory material. Referring to FIG. 5, setting and resetting memory element 15 (addressed by column line 10a and row line 20a) involves, in one example, supplying a voltage to column line 10a to introduce a current into the volume of memory material 30 as illustrated in FIG. 1 or memory material 290 as illustrated in FIG. 12. The current causes a temperature increase at the volume of memory material 30. Referring to FIG. 5, to amorphize a volume of memory material, the volume of memory material is heated to a temperature beyond the amorphisizing temperature, $T_M$. Once a temperature beyond $T_M$ is reached, the volume of memory material is quenched or cooled rapidly (by removing the current flow). The quenching is accomplished at a rate, $t_1$, that is faster than the rate at which the volume of memory material 30 can crystallize so that the volume of memory material 30 retains its amorphous state. To crystallize a volume of memory material 30, the temperature is raised by current flow to the crystallization temperature for the material and retained at that temperature for a sufficient time to crystallize the material. After such time, the volume of memory material is quenched (by removing the current flow).

In each of these examples of resetting and setting a volume of memory material 30, the importance of concentrating the temperature delivery at the volume of memory material 30 is illustrated. One way this is accomplished is modifying a portion of the electrode as described above. The inset of FIG. 6 shows memory cell 15 having an electrode with modified portion 35 (illustrated as a resistor) to concentrate heat (current) at the volume of memory material 30.

In the preceding example, the volume of memory material 30 was heated to a high temperature to amorphisize the material and reset the memory element (e.g., program 0). Heating the volume of memory material to a lower crystallization temperature crystallizes the material and sets the memory element (e.g., program 1). It is to be appreciated that the association of reset and set with amorphous and crystalline material, respectively, is a convention and that at least an opposite convention may be adopted. It is also to be appreciated from this example that the volume of memory material 30 need not be partially set or reset by varying the current flow and duration through the volume of memory material.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus comprising:
   a dedicated memory chip including a plurality of first address lines and a plurality of second address lines on a silicon substrate, addressing circuitry coupled to the plurality of first address lines and the plurality of second address lines, a plurality of memory cells formed between respective ones of the plurality of first address lines and the plurality of second address lines each memory cell comprising:
   a silicon on insulator device including an insulator layer disposed in the silicon substrate;

an isolation device including a first conductivity type portion disposed in the silicon substrate above the insulator layer;

a second conductivity type portion adjacent to the first conductivity type portion;

an electrode on the second conductivity type portion; and a volume of programmable material disposed over the electrode.

2. The apparatus according to claim 1, wherein the silicon substrate is a monocrystalline silicon susbstrate.

3. The apparatus according to claim 1, wherein the insulator layer includes a dielectric-forming material disposed in the silicon substrate in a depth range from about 500 Å to about 5,000 Å.

4. The apparatus according to claim 1, wherein the insulator layer includes oxygen disposed in the silicon substrate, in a concentration range from about $10^{16}$ to about $10^{19}$ atoms per cubic centimeter.

5. The apparatus according to claim 1, wherein the silicon on insulator device further includes a shallow isolation structure disposed above the insulator layer.

6. The apparatus according to claim 1, wherein the first conductivity type portion in the silicon substrate and the second conductivity type portion adjacent to the first conductivity type portion in the silicon substrate includes respective N-doped and P-doped portions.

7. The apparatus according to claim 1, wherein the first conductivity type portion in the silicon substrate and the second conductivity type portion adjacent to the first conductivity type portion in the silicon includes respective N-doped and P-doped portions, wherein the N-doped portion has a concentration on the order of about $10^{17}$–$10^{18}$ atoms/cm3, and wherein the P-doped portion has a concentration on the order of about $10^{19}$–$10^{20}$ atoms/cm3.

8. The apparatus according to claim 1, wherein the electrode includes a metal compound film.

9. The apparatus according to claim 1, wherein the electrode includes a polysilicon film.

10. The apparatus according to claim 1, including a dielectric layer over said electrode and under said volume of programmable material, a recess formed in said dielectric layer, said volume of programmable material including a chalcogenide material disposed in said recess, at least one liner layer disposed on said chalcogenide material and in said recess and a signal line material exposed in said recess.

* * * * *